United States Patent
Zhang et al.

(10) Patent No.: US 9,525,060 B2
(45) Date of Patent: Dec. 20, 2016

(54) REDUCED AREA POWER DEVICES USING DEEP TRENCH ISOLATION

(71) Applicant: Texas Instruments Incorporated, Dallas, TX (US)

(72) Inventors: Yongxi Zhang, Plano, TX (US); Sameer Pendharkar, Allen, TX (US); Seetharaman Sridhar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 76 days.

(21) Appl. No.: 14/563,028

(22) Filed: Dec. 8, 2014

(65) Prior Publication Data

US 2015/0171211 A1 Jun. 18, 2015

Related U.S. Application Data

(60) Provisional application No. 61/916,843, filed on Dec. 17, 2013.

(51) Int. Cl.

| H01L 29/78 | (2006.01) |
|---|---|
| H01L 29/66 | (2006.01) |
| H01L 29/10 | (2006.01) |
| H01L 21/762 | (2006.01) |
| H01L 29/06 | (2006.01) |
| H01L 29/08 | (2006.01) |

(52) U.S. Cl.
CPC ......... *H01L 29/7816* (2013.01); *H01L 21/762* (2013.01); *H01L 29/0623* (2013.01); *H01L 29/0692* (2013.01); *H01L 29/0696* (2013.01); *H01L 29/1095* (2013.01); *H01L 29/66659* (2013.01); *H01L 29/66681* (2013.01); *H01L 29/7835* (2013.01); *H01L 29/0653* (2013.01); *H01L 29/0878* (2013.01)

(58) Field of Classification Search
None
See application file for complete search history.

(56) References Cited

U.S. PATENT DOCUMENTS

| 6,750,489 B1 * | 6/2004 | Merrill | H01L 27/14609 257/292 |
|---|---|---|---|
| 2010/0258867 A1 * | 10/2010 | Lee | H01L 29/0634 257/339 |
| 2011/0115016 A1 * | 5/2011 | Cha | H01L 21/76264 257/337 |
| 2015/0021687 A1 * | 1/2015 | Tamura | H01L 29/7816 257/343 |

* cited by examiner

*Primary Examiner* — Laura Menz
*Assistant Examiner* — Candice Y Chan
(74) *Attorney, Agent, or Firm* — Jacqueline J. Garner; Charles A. Brill; Frank D. Cimino (57) ABSTRACT

An integrated circuit including an isolated device which is isolated with a lower buried layer combined with deep trench isolation. An upper buried layer, with the same conductivity type as the substrate, is disposed over the lower buried layer, so that electrical contact to the lower buried layer is made at a perimeter of the isolated device. The deep trench isolation laterally surrounds the isolated device. Electrical contact to the lower buried layer sufficient to maintain a desired bias to the lower buried layer is made along less than half of the perimeter of the isolated device, between the upper buried layer and the deep trench.

10 Claims, 14 Drawing Sheets

REDUCED AREA POWER DEVICES USING DEEP TRENCH ISOLATION

CROSS-REFERENCE TO RELATED APPLICATIONS

This application claims the benefit of priority under U.S.C. §119(e) of U.S. Provisional Application 61/916,843, filed Dec. 17, 2013, which is hereby incorporated by reference in its entirety.

FIELD OF THE INVENTION

This invention relates to the field of integrated circuits. More particularly, this invention relates to isolation structures in integrated circuits.

BACKGROUND OF THE INVENTION

An integrated circuit may include deep trench isolation structures to laterally isolate components such as power transistors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may include devices such as metal oxide semiconductor (MOS) transistors which are isolated from the substrate of the integrated circuit by a lower buried layer combined with deep trench isolation. The lower buried layer has an opposite electrical conductivity type from the substrate. An upper buried layer, with the same conductivity type as the substrate, is disposed over the lower buried layer, so that electrical contact to the lower buried layer is made at a perimeter of the isolated device. The deep trench isolation laterally surrounds the isolated device. Electrical contact to the lower buried layer sufficient to maintain a desired bias to the lower buried layer is made along a portion, less than half, of the perimeter of the isolated device, between the upper buried layer and the deep trench.

DETAILED DESCRIPTION OF EXAMPLE EMBODIMENTS

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may include devices such as MOS transistors which are isolated from a substrate of the integrated circuit by a lower buried layer combined with deep trench isolation. The lower buried layer has an opposite electrical conductivity type from the substrate. An upper buried layer, with the same conductivity type as the substrate, is disposed over the lower buried layer, so that electrical contact to the lower buried layer is made at a perimeter of the isolated device. The deep trench isolation laterally surrounds the isolated device. Electrical contact to the lower buried layer sufficient to maintain a desired bias to the lower buried layer is made along a portion, less than half, of the perimeter of the isolated device, between the upper buried layer and the deep trench.

The embodiments described in this Description will be isolated by n-type lower buried layers in a p-type substrate. It will be recognized that devices of opposite polarity may be isolated by p-type lower buried layers in an n-type substrate by appropriate changes in polarities of relevant dopants of elements such as wells and source/drain regions of the devices.

Figure 1:
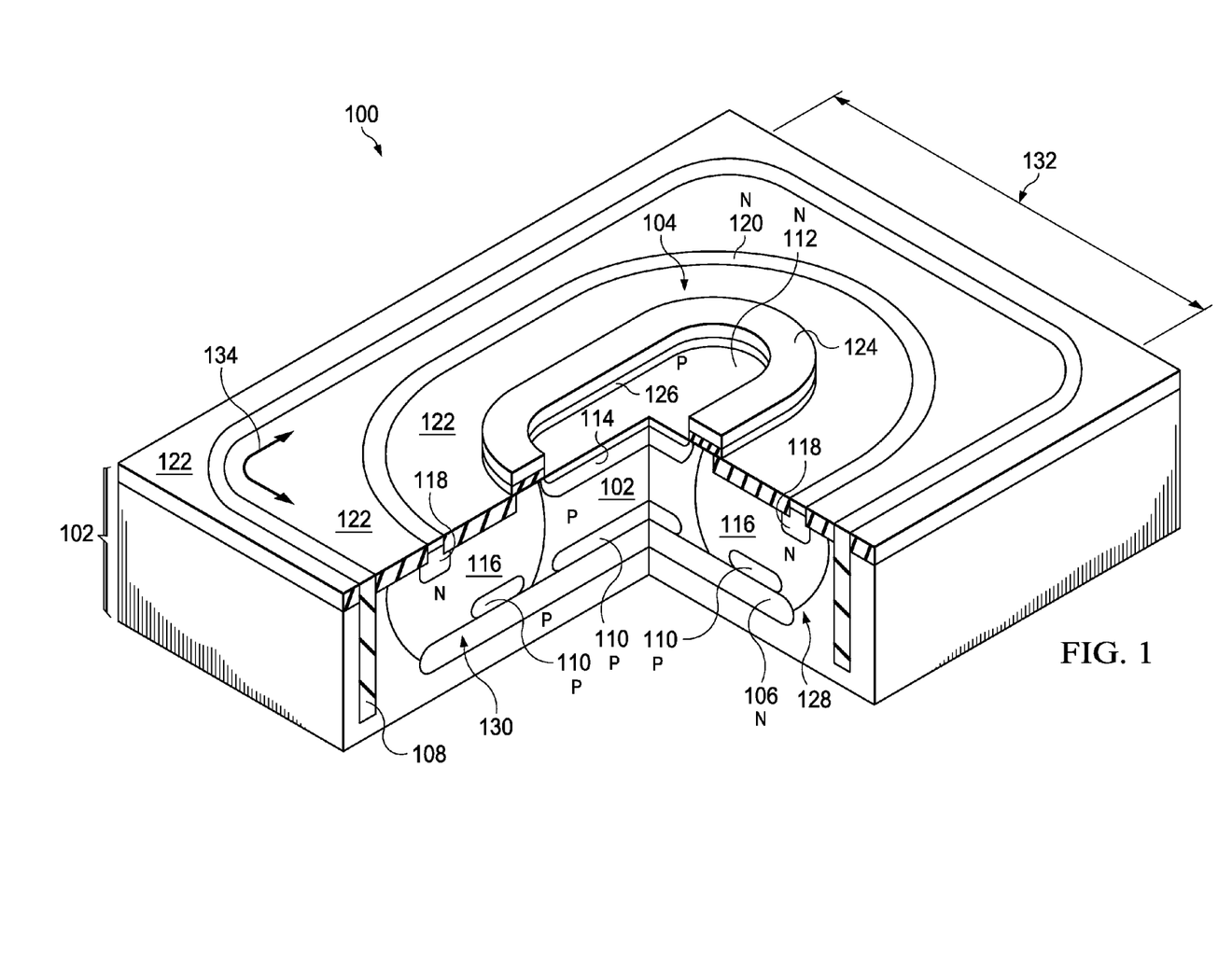
FIG. 1 is a cross section of an integrated circuit containing a high-side laterally diffused n-channel MOS transistor formed according to an embodiment.

FIG. 1 is a cross section of an integrated circuit containing a high-side laterally diffused n-channel MOS transistor formed according to an embodiment. The integrated circuit 100 is formed in and on a p-type semiconductor substrate 102 which may be a single crystal silicon wafer, a silicon-on-insulator (SOI) wafer, a hybrid orientation technology (HOT) wafer with regions of different crystal orientations, or other material appropriate for fabrication of the integrated circuit 100. The high-side laterally diffused n-channel MOS transistor 104 is electrically isolated from the substrate 102 by an n-type lower buried layer 106 combined with deep trench isolation 108 which laterally surrounds the transistor 104. A p-type upper buried layer 110 is disposed under the transistor 104 and over the lower buried layer 106.

The high-side laterally diffused n-channel MOS transistor 104 of the instant embodiment includes a central n-type source 112 in a p-type body well 114. An n-type deep well 116 surrounds the body well 114 and provides a drain drift region of the transistor 104. An n-type drain well 118 and an n-type drain contact region 120 in the deep well 116 provide an extended drain of the transistor 104. Field oxide 122 is disposed at a top surface of the substrate 102 surrounding a channel area of the transistor 104 and laterally isolating the drain contact region 120. The transistor 104 includes a gate 124 and a gate dielectric layer 126 disposed over the channel area and overlapping the body well 114 and the deep well 116.

The lower buried layer 106 is electrically biased through the deep well 116. During operation of the integrated circuit 100, the lower buried layer 106 requires current to maintain a desired bias so as to electrically isolate the transistor 104. Providing the requisite current through the deep well 116 necessitates a certain area of contact between the deep well 116 and the lower buried layer 106. In the instant embodiment, contact between the deep well 116 and the lower buried layer 106 along a length 128 of the transistor 104 is insufficient to provide the requisite current to maintain a desired bias on the lower buried layer 106, due to proximity of the deep trench isolation structure 108 to the upper buried layer 110. The deep trench isolation structure 108 may be disposed proximate to the upper buried layer 110, for example, to advantageously reduce an area of the transistor 104. To provide sufficient contact area between the deep well 116 and the lower buried layer 106, a lateral separation between the deep trench isolation structure 108 and the upper buried layer 110 along a width 130 on at least one end of the transistor 104 is at least one micron wider than a lateral separation between the deep trench isolation structure 108 and the upper buried layer 110 along the length 128 of the transistor 104. Contact between the deep well 116 and the lower buried layer 106 is increased by at least a micron along the width 130 on at least one end of the transistor 104 compared to the contact between the deep well 116 and the lower buried layer 106 along the length 128 of the transistor 104. A lateral width 132 of the increased contact is less than one half a perimeter 134 of the transistor 104.

Figure 2A:
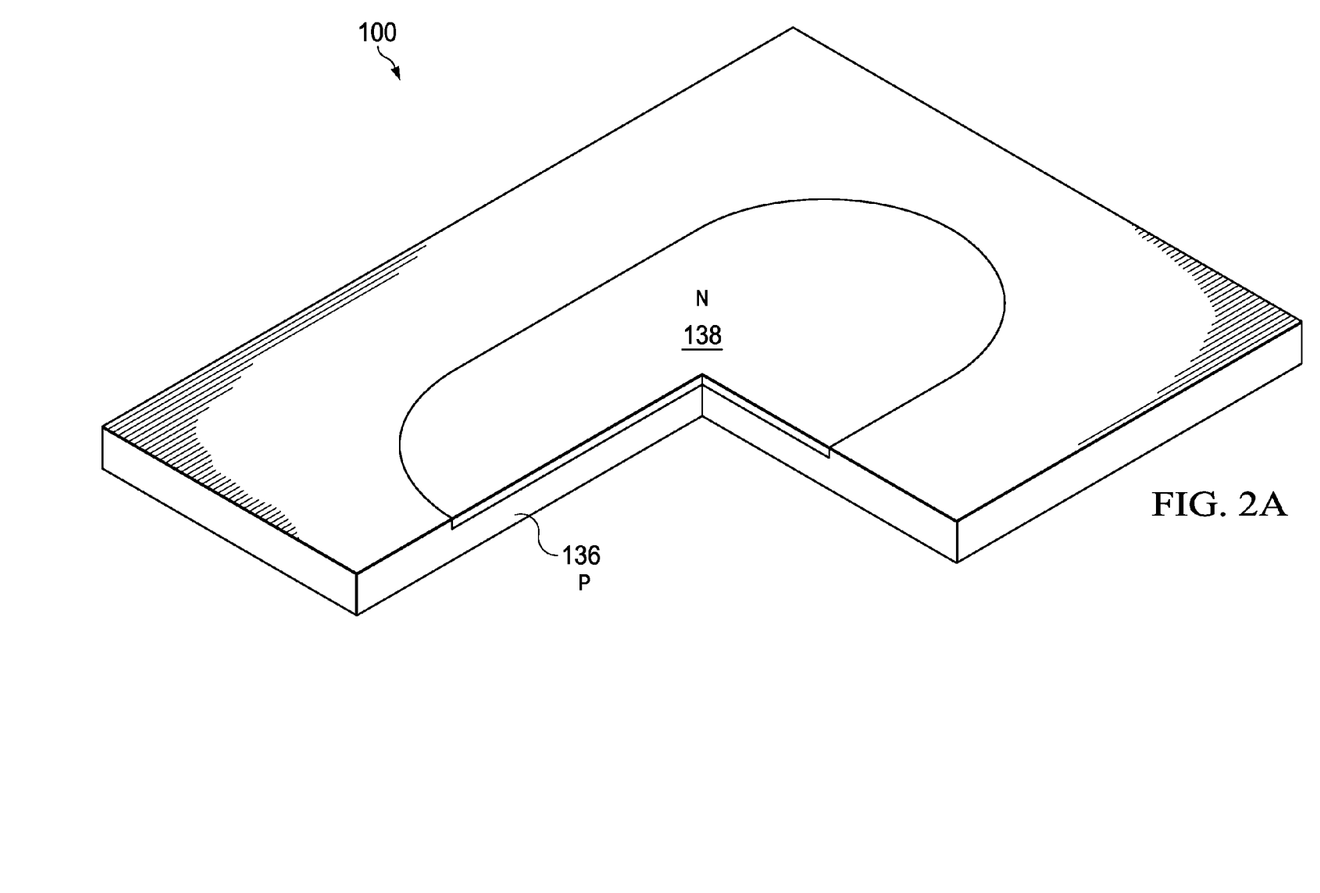
FIG. 2A through FIG. 2G are cross sections of the integrated circuit of FIG. 1, depicted in successive stages of fabrication.

FIG. 2A through FIG. 2G are cross sections of the integrated circuit of FIG. 1, depicted in successive stages of fabrication. Referring to FIG. 2A, formation of the integrated circuit 100 starts with a p-type base substrate 136 of the substrate 102. A lower buried layer implanted region 138 is formed in the base substrate 136, for example, by ion implanting antimony through exposed areas of an implant mask at a dose of $1 \times 10^{15}$ cm$^{-2}$ to $5 \times 10^{15}$ cm$^{-2}$ at an energy of 40 keV to 80 keV into an area defined for the lower buried layer 106 of FIG. 1. The implant mask may include, for example, photoresist and/or a layer of silicon dioxide.

Figure 2B:
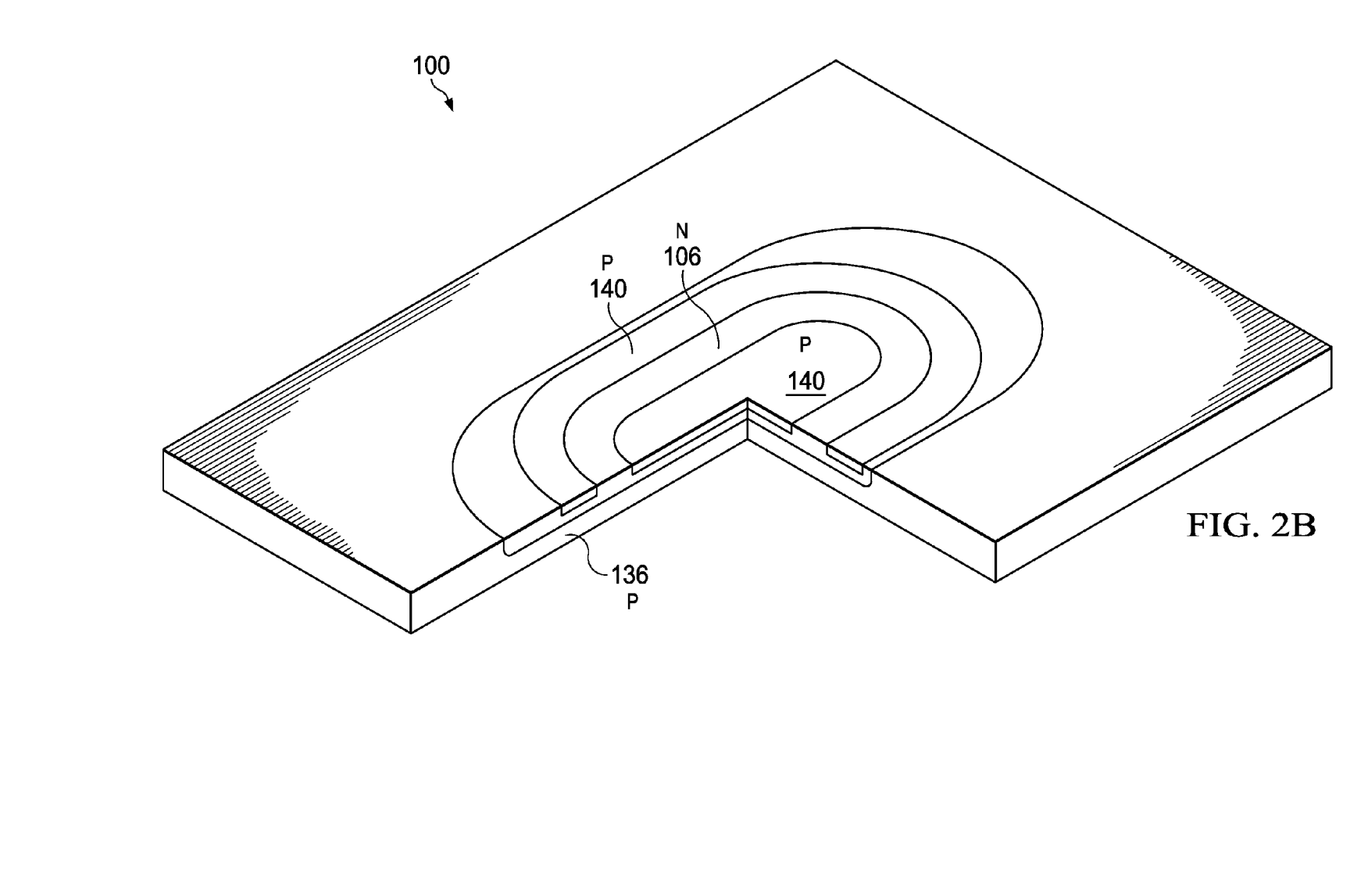

Referring to FIG. 2B, a first thermal drive operation is performed which heats the base substrate 136 so as to diffuse and activate the implanted n-type dopants in the lower buried layer implanted region 138 of FIG. 2A to form the lower buried layer 106. The first thermal drive operation may include, for example, heating the base substrate 136 for 10 minutes at 1250 C to 200 minutes at 1100 C. A layer of thermal silicon dioxide may be grown on the base substrate 136 during the first thermal drive operation. Subsequently, an upper buried layer implanted region 140 is formed in the base substrate 136, for example, by ion implanting boron through exposed areas of an implant mask at a dose of $2 \times 10^{15}$ cm$^{-2}$ to $5 \times 10^{15}$ cm$^{-2}$ at an energy of 50 keV to 100 keV into an area defined for the upper buried layer 110 of FIG. 1.

Figure 2C:
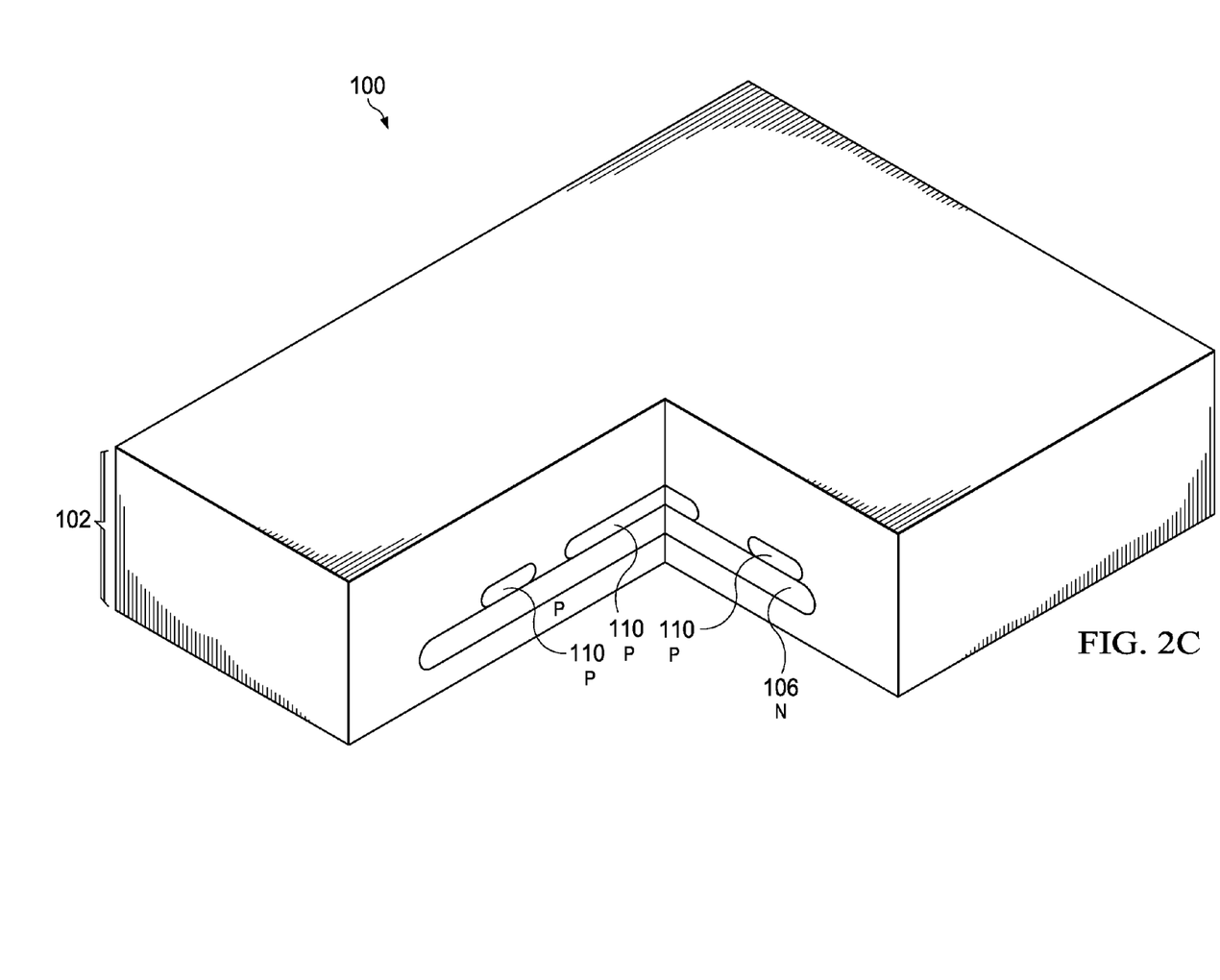

Referring to FIG. 2C, a second thermal drive operation is performed which heats the base substrate 136 of FIG. 2B so as to diffuse and activate the implanted p-type dopants in the upper buried layer implanted region 140. The second thermal drive operation may include, for example, heating the base substrate 136 for 10 minutes at 950 C to 300 minutes at 850 C. Subsequently, an epitaxial process is performed which forms an epitaxial layer of p-type semiconductor, for example silicon with a conductivity of 5 to 10 ohm-cm and 5 to 8 microns thick, on the base substrate 136. The base substrate 136 and the epitaxial layer form the substrate 102. The lower buried layer 106 may increase in size during the second thermal drive operation and the epitaxial process as the n-type dopants further diffuse.

Figure 2D:
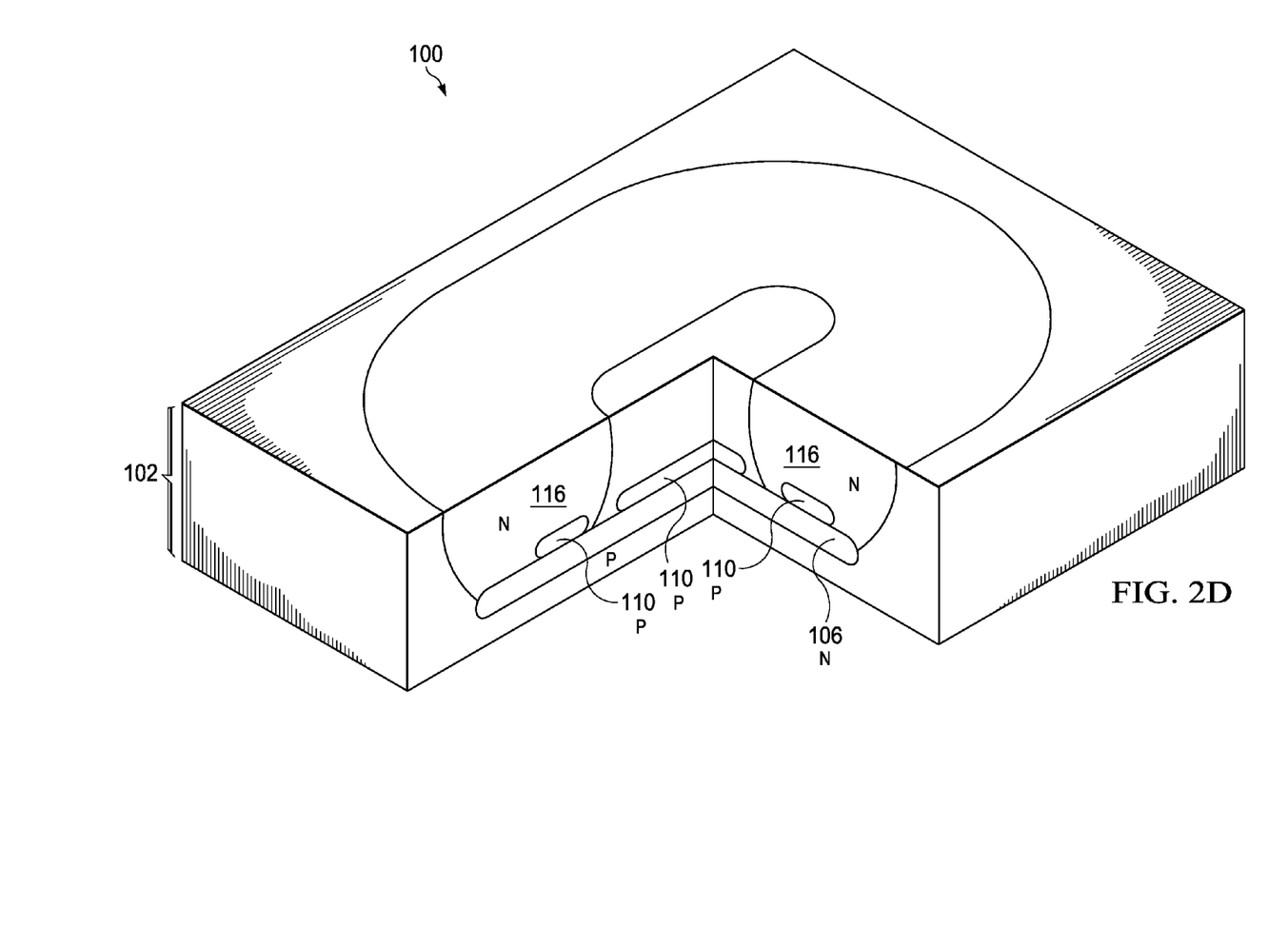

Referring to FIG. 2D, the n-type deep well 116 is formed so as to extend from the top surface of the substrate 102 to the lower buried layer 106. The deep well 116 may be formed, for example, by ion implanting phosphorus at a dose of $1 \times 10^{12}$ cm$^{-2}$ to $3 \times 10^{12}$ cm$^{-2}$ at an energy of 1500 keV to 2200 keV and ion implanting arsenic at a dose of $1 \times 10^{12}$ cm$^{-2}$ to $5 \times 10^{12}$ cm$^{-2}$ at an energy of 125 keV to 175 keV through exposed areas of an implant mask into an area defined for the deep well 116, followed by a third thermal drive operation, for example 80 minutes at 1200 C to 750 minutes at 1100 C.

Figure 2E:
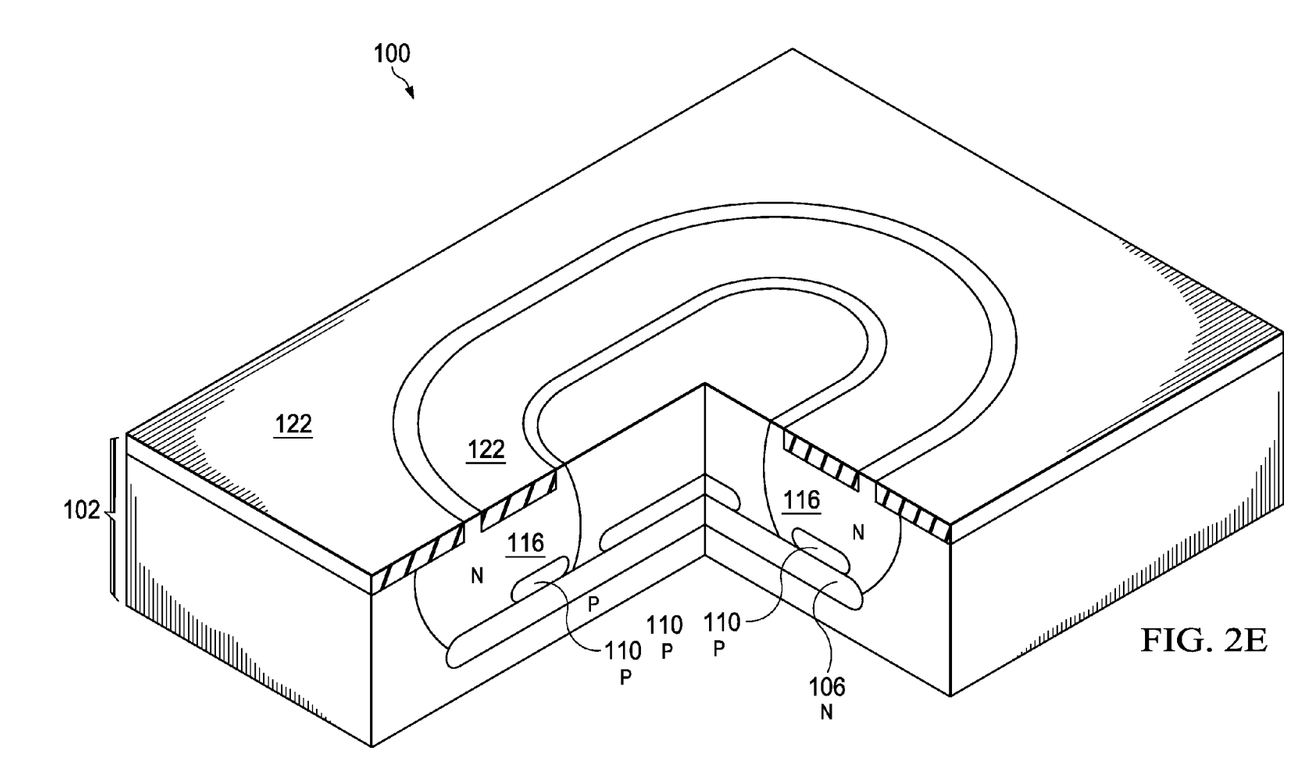

Referring to FIG. 2E, the field oxide 122 is formed at the top surface of the substrate 102. The field oxide 122 may be formed, for example, using shallow trench isolation (STI) or local oxidation of silicon (LOCOS) processes. An STI process may include the steps of: forming an oxide layer on the substrate 102, forming a silicon nitride layer on the oxide layer, patterning the silicon nitride layer so as to expose an area for the field oxide 122, etching a trench in the substrate 102 in the exposed area to an appropriate depth for a desired thickness of the field oxide 122, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer. A LOCOS process may include the steps of: forming an oxide layer on the substrate 102, forming a silicon nitride layer on the oxide layer, patterning the silicon nitride layer so as to expose an area for the field oxide 122, growing thermal oxide at the top surface of the substrate 102 in the exposed area to an appropriate thickness for a desired thickness of the field oxide 122, and removing the silicon nitride layer.

Figure 2F:
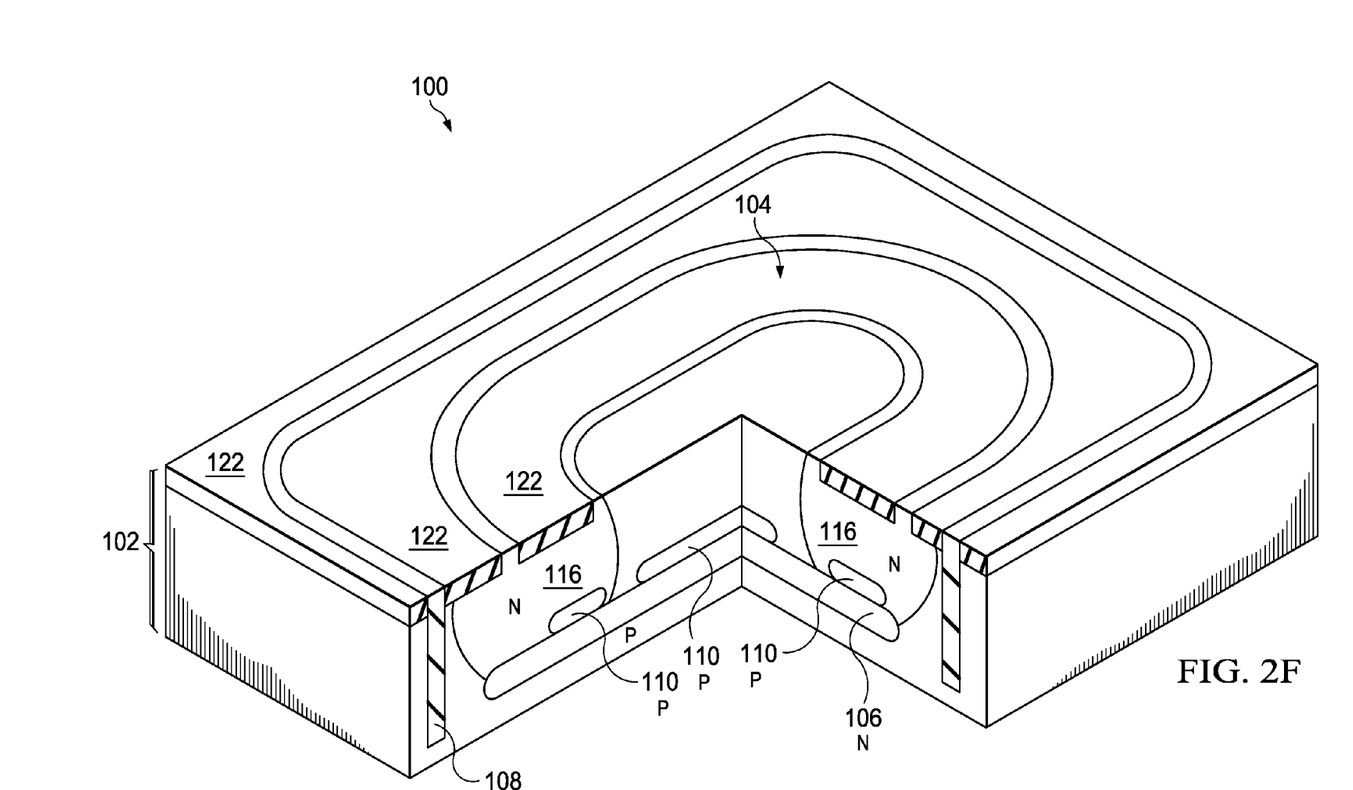

Referring to FIG. 2F, the deep trench isolation structure 108 is formed surrounding the transistor 104. The deep trench isolation structure 108 may be formed, for example, by etching a trench 15 to 30 microns deep and 1.5 to 2.5 microns wide in the substrate 102, using a deep reactive ion etch (DRIE) process. An example DRIE process uses $SF_6$ and oxygen in a steady state plasma etch process to etch a bottom of the trench while passivating sidewalls of the trench with oxygen. After the trench is etched, a thermal oxide liner 100 to 300 nanometers thick may be formed on sidewalls and a bottom of the trench. Subsequently, a layer of silicon dioxide 200 to 400 nanometers thick may be formed on the thermal oxide liner using a sub-atmospheric chemical vapor deposition (SACVD) process. Conformal polysilicon may be formed to fill the trench, and polysilicon outside the trench may be removed with a CMP or etchback process. Alternately, conformal dielectric material may be formed in the trench on the thermal oxide liner using a spin-on inorganic based solution such as a perhydrosilazane-based inorganic material. In an alternate version of the instant embodiment, the field oxide 122 and the deep trench isolation structure 108 may be filled concurrently.

Figure 2G:
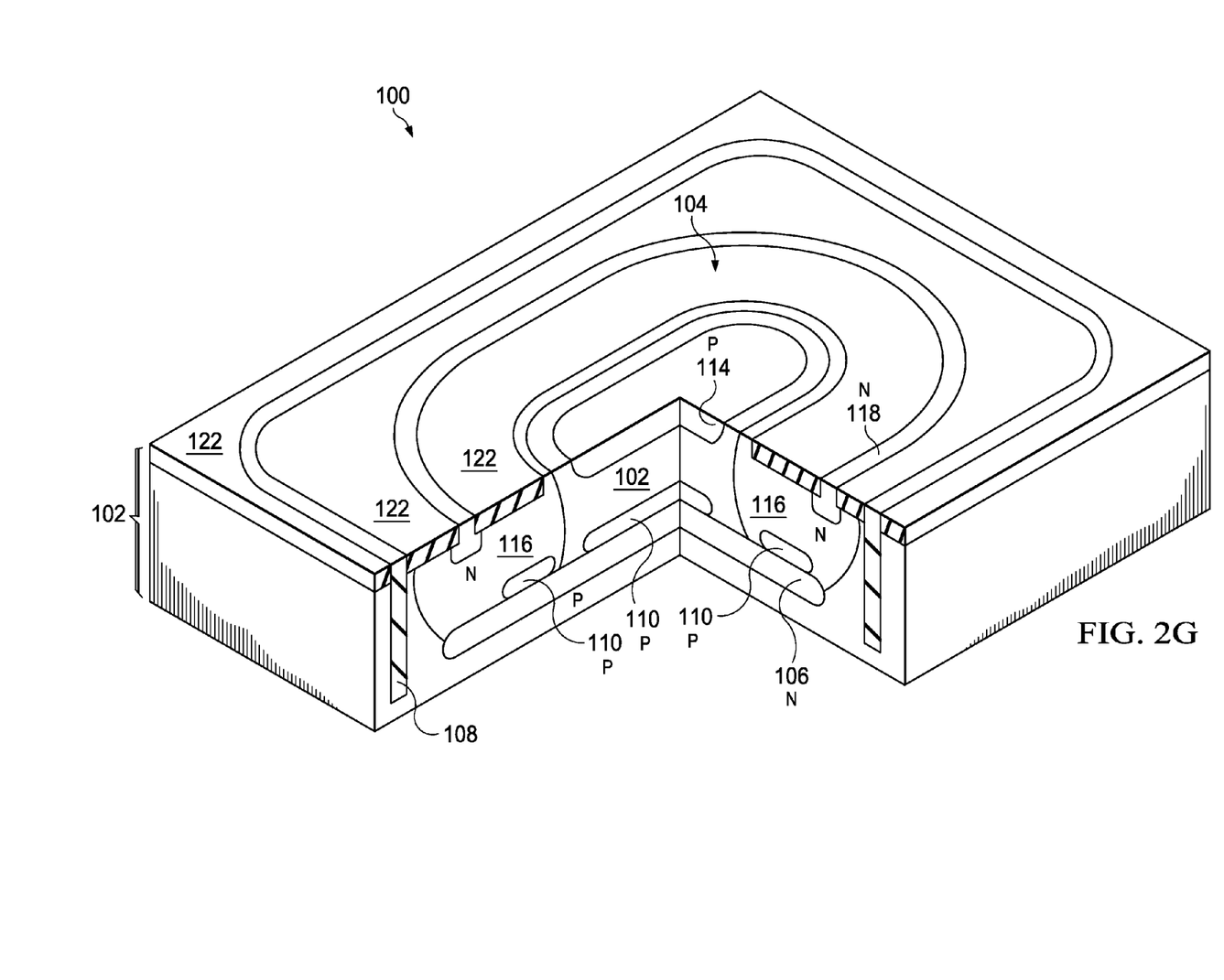

Referring to FIG. 2G, the p-type body well 114 may be formed, for example, by ion implanting boron in two implant steps, first at a dose of $1 \times 10^{14}$ cm$^{-2}$ to $2 \times 10^{14}$ cm$^{-2}$ at an energy of 100 keV to 130 keV, and second at a dose of $1 \times 10^{13}$ cm$^{-2}$ to $3 \times 10^{13}$ cm$^{-2}$ at an energy of 350 keV to 400 keV, through exposed areas of an implant mask into an area defined for the body well 114, followed by a body well anneal operation, for example 10 second at 1100 C to 100 seconds at 1000 C. The n-type drain well 118 may be formed, for example, by ion implanting boron in three implant steps, first at a dose of $2 \times 10^{12}$ cm$^{-2}$ to $6 \times 10^{12}$ cm$^{-2}$ at an energy of 125 keV to 175 keV, second at a dose of $2\times10^{12}$ cm$^{-2}$ to $6\times10^{12}$ cm$^{-2}$ at an energy of 300 keV to 350 keV, and third at a dose of $2\times10^{13}$ cm$^{-2}$ to $6\times10^{13}$ cm$^{-2}$ at an energy of 625 keV to 725 keV, through exposed areas of an implant mask into an area defined for the drain well 118, followed by a drain well anneal operation similar to the body well anneal. The body well anneal and the drain well anneal may be performed concurrently.

Figure 3:
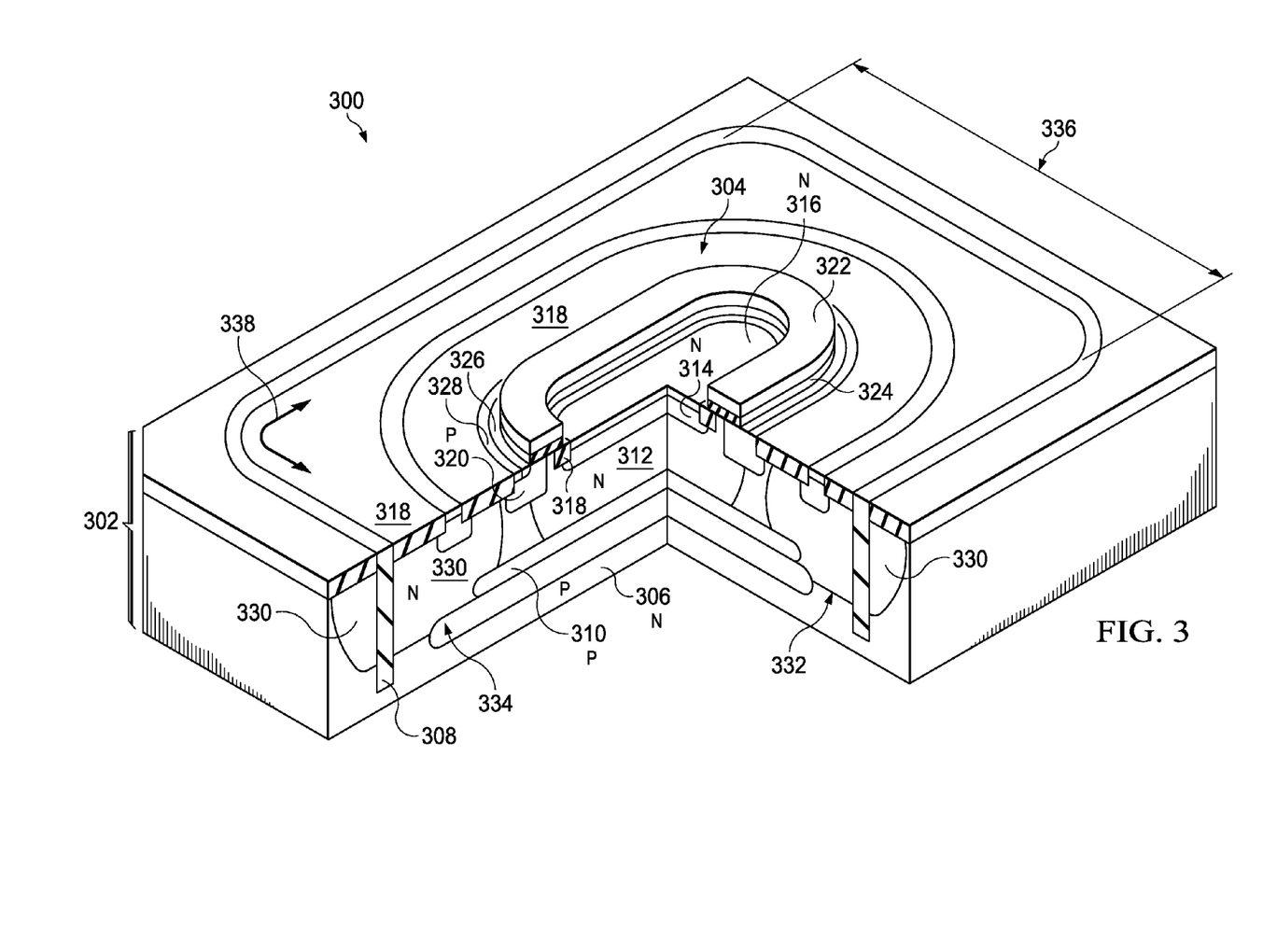
FIG. 3 is a cross section of an integrated circuit containing an isolated extended drain n-channel MOS transistor formed according to an embodiment.

FIG. 3 is a cross section of an integrated circuit containing an isolated extended drain n-channel MOS transistor formed according to an embodiment. The integrated circuit 300 is formed in and on a p-type semiconductor substrate 302 as described in reference to FIG. 1. The isolated extended drain n-channel MOS transistor 304 is electrically isolated from the substrate 302 by an n-type lower buried layer 306 combined with deep trench isolation 308 which laterally surrounds the transistor 304. A p-type upper buried layer 310 is disposed under the transistor 304 and over the lower buried layer 306.

The isolated extended drain n-channel MOS transistor 304 of the instant embodiment includes a central n-type drain drift region 312. An n-type drain well 314 is disposed in the drain drift region 312, and an n-type drain contact region 316 is disposed in the drain well 314.

Field oxide 318 laterally isolates the drain contact region 316 from a channel area of the transistor 304. A p-type body well 320 is disposed around the drain drift region 312, extending into a channel area of the transistor 304. A gate 322 and gate dielectric layer 324 are disposed over the channel area and overlap the drain drift region 312 and the body well 320. An n-type source 326 is disposed in the body well 320 adjacent to the gate 322, and a p-type body contact region 328 is disposed in the body well 320.

The lower buried layer 306 is electrically biased through an n-type deep well 330. During operation of the integrated circuit 300, a certain area of contact between the deep well 330 and the lower buried layer 306 is required, as described in reference to FIG. 1. In the instant embodiment, contact between the deep well 330 and the lower buried layer 306 along a length 332 of the transistor 304 is insufficient to provide the requisite current to maintain a desired bias on the lower buried layer 306, due to proximity of the deep trench isolation structure 308 to the upper buried layer 310, as described in reference to FIG. 1. To provide sufficient contact area between the deep well 330 and the lower buried layer 306, a lateral separation between the deep trench isolation structure 308 and the upper buried layer 310 along a width 334 on at least one end of the transistor 304 is at least one micron wider than a lateral separation between the deep trench isolation structure 308 and the upper buried layer 310 along the length 332 of the transistor 304. Contact between the deep well 330 and the lower buried layer 306 is increased by at least a micron along the width 334 on at least one end of the transistor 304 compared to the contact between the deep well 330 and the lower buried layer 306 along the length 332 of the transistor 304. A lateral width 336 of the increased contact is less than one half a perimeter 338 of the transistor 304. In one version of the instant embodiment, the deep well 330 may extend past the deep trench isolation structure 308 as depicted in FIG. 3.

Figure 4:
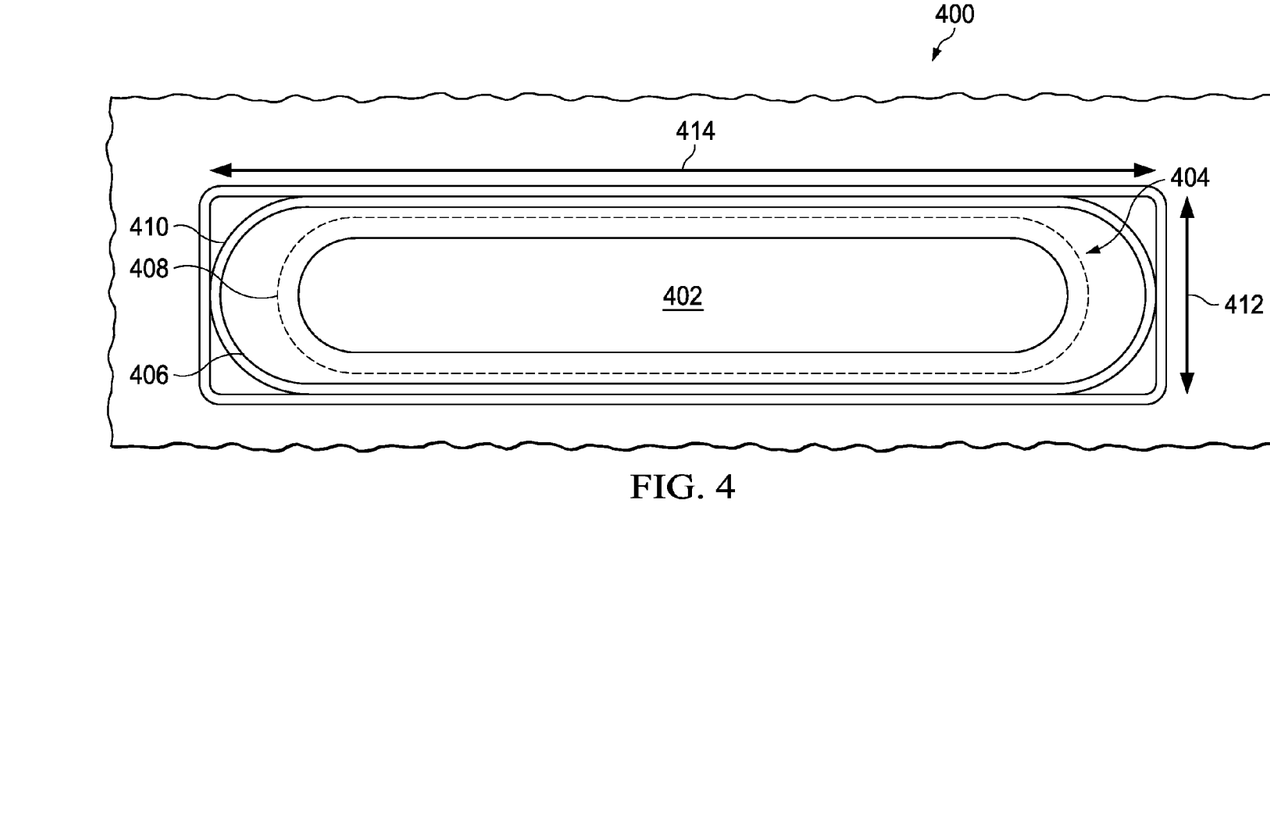
FIG. 4 through FIG. 8 are top views of integrated circuits containing isolated devices formed according to embodiments, depicting example layouts.

FIG. 4 through FIG. 8 are top views of integrated circuits containing isolated devices formed according to embodiments, depicting example layouts. Field oxide, gates, source and drain regions and other elements of the isolated devices are not shown, so as to depict configurations of lower buried layers, upper buried layers and deep wells with respect to deep trench isolation structures. Referring to FIG. 4, the integrated circuit 400 includes the isolated device 402 surrounded by a single deep trench isolation structure 404. The isolated device 402 is electrically isolated from a substrate of the integrated circuit 400 by a combination of the deep trench isolation structure 404 and a lower buried layer 406 as described in reference to FIG. 1, the lower buried layer 406 having an opposite conductivity type from the substrate. An upper buried layer 408 is disposed over the lower buried layer 406, the upper buried layer 408 having the same conductivity type as the substrate. A deep well 410 having the same conductivity type as the lower buried layer 406 is disposed over a portion of the lower buried layer 406 which extends past the upper buried layer 408. The deep well 410 makes electrical contact to the lower buried layer 406.

To provide sufficient contact area between the deep well 410 and the lower buried layer 406, a lateral separation between the deep trench isolation structure 404 and the upper buried layer 408 along a width 412 on at least one end of the device 402 is at least one micron wider than a lateral separation between the deep trench isolation structure 404 and the upper buried layer 408 along a length 414 of the device 402. Contact between the deep well 410 and the lower buried layer 406 is increased by at least a micron along the width 412 on at least one end of the device 402 and possibly at two opposite ends of the device 402 compared to the contact between the deep well 410 and the lower buried layer 406 along the length 414 of the device 402.

Figure 5:
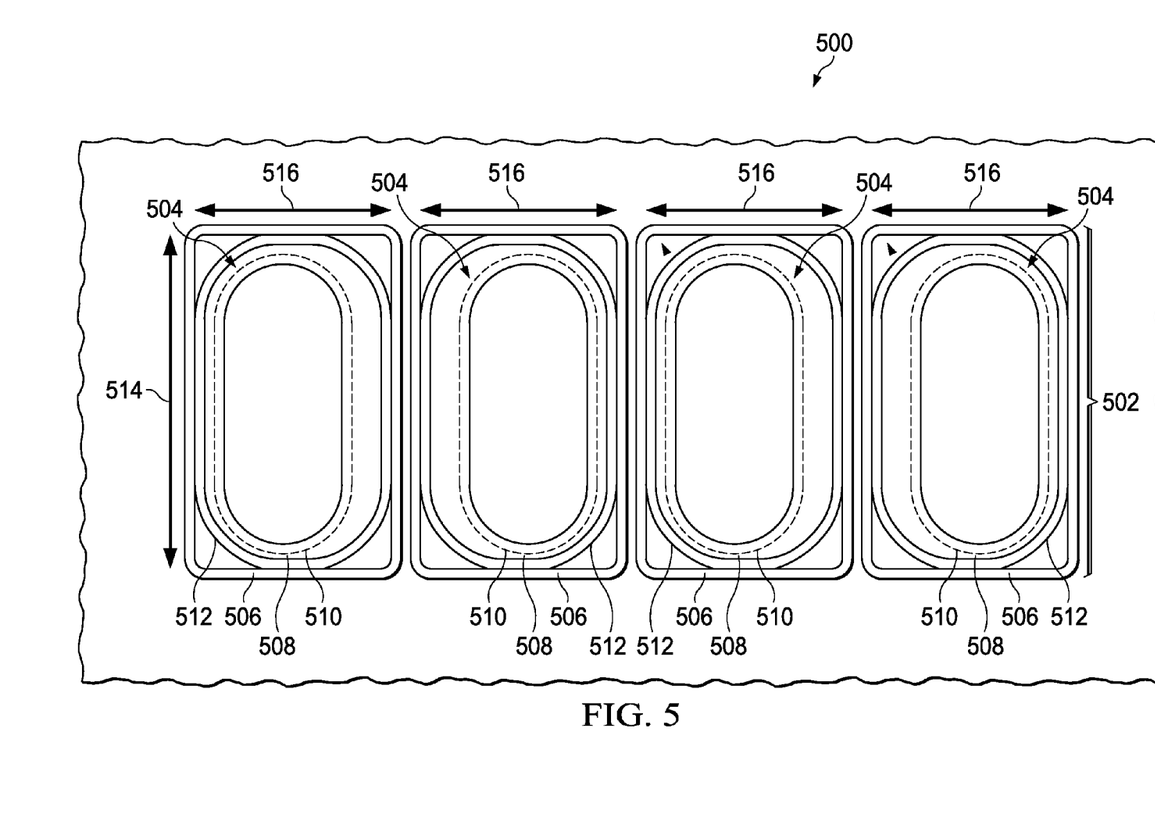

Referring to FIG. 5, the integrated circuit 500 includes the isolated device 502 comprising a plurality of separate isolated sub-devices 504 in which each sub-device 504 is surrounded by a separate deep trench isolation structure 506. Each isolated sub-device 504 is electrically isolated from a substrate of the integrated circuit 500 by a combination of the respective deep trench isolation structure 506 and a lower buried layer 508 enclosed by the deep trench isolation structure 506, the lower buried layer 508 having an opposite conductivity type from the substrate. An upper buried layer 510 of each sub-device 504 is disposed over the lower buried layer 508, the upper buried layer 510 having the same conductivity type as the substrate. A deep well 512 of each sub-device 504 having the same conductivity type as the lower buried layer 508 is disposed over a portion of the respective lower buried layer 508 which extends past the upper buried layer 510. The deep well 512 makes electrical contact to the lower buried layer 508.

To provide sufficient contact area between each instance of the deep well 512 and the respective lower buried layer 508, a lateral separation between the respective deep trench isolation structure 506 and the upper buried layer 510 along a length 514 on exactly one side of each sub-device 504 is at least one micron wider than a lateral separation between the deep trench isolation structure 506 and the upper buried layer 510 along a width 516 of each sub-device 504. Contact between each deep well 512 and the respective lower buried layer 508 is increased by at least a micron along the length 514 of the sub-device 504 compared to the contact between the deep well 512 and the lower buried layer 508 along the width 516 of the sub-device 504.

Figure 6:
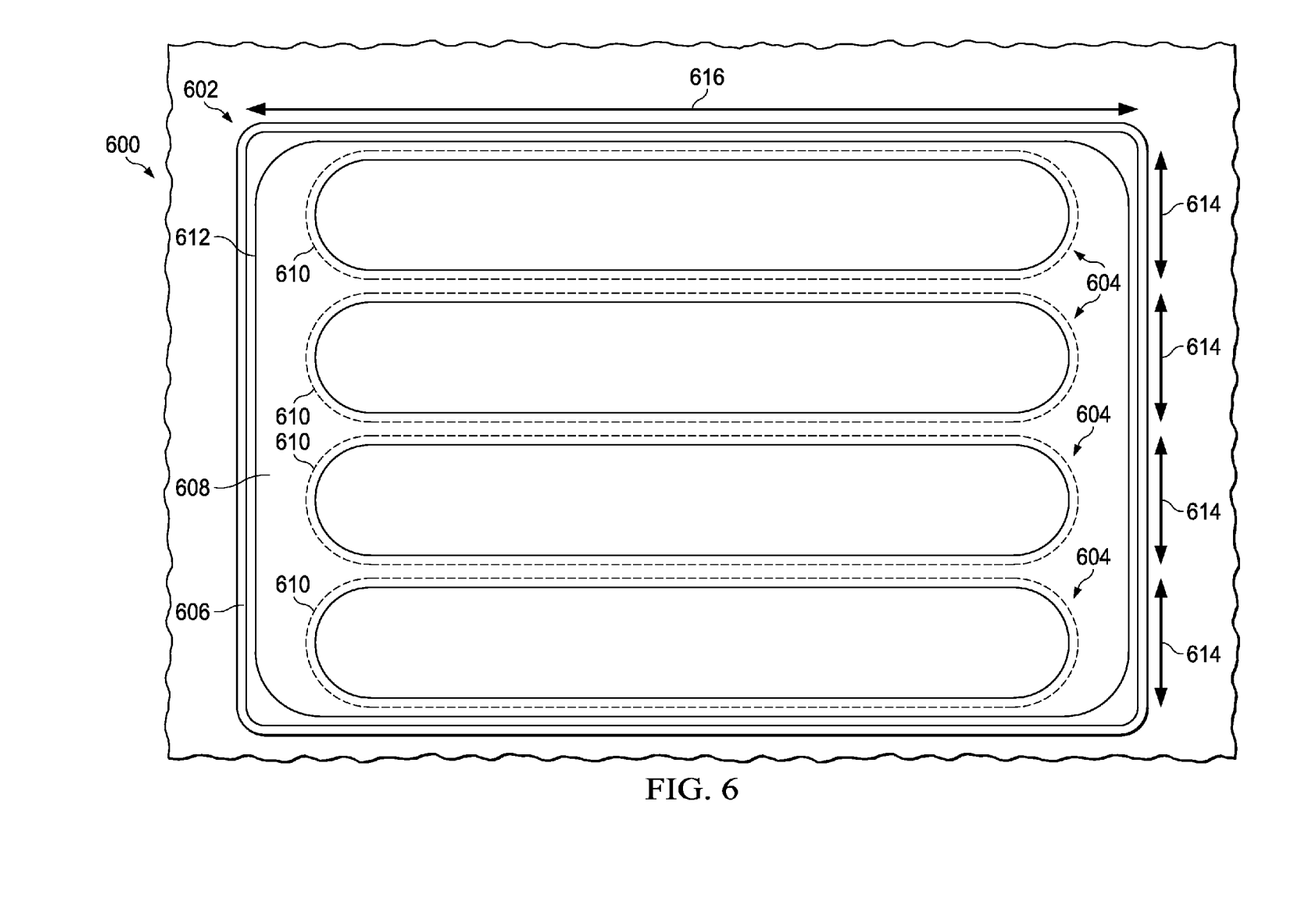

Referring to FIG. 6, the integrated circuit 600 includes the isolated device 602 comprising a plurality of isolated sub-devices 604 all of which are surrounded by one deep trench isolation structure 606. The sub-devices 604 are configured in a linear array so that adjacent sub-devices 604 abut along their respective lengths 616. The isolated sub-devices 604 are electrically isolated from a substrate of the integrated circuit 600 by a combination of the deep trench isolation structure 606 and a lower buried layer 608 enclosed by the deep trench isolation structure 606, the lower buried layer 608 having an opposite conductivity type from the substrate. Each sub-device 604 includes an instance of an upper buried layer 610 disposed over the lower buried layer 608, the upper buried layer 610 having the same conductivity type as the substrate. A deep well 612 of the sub-devices 604 having the same conductivity type as the lower buried layer 608 is disposed over a portion of the lower buried layer 608 which extends past the upper buried layers 610. The deep well 612 makes electrical contact to the lower buried layer 608.

To provide sufficient contact area between the deep well 612 and the lower buried layer 608, a lateral separation between the deep trench isolation structure 606 and the upper buried layers 610 along widths 614 on at least one side of each sub-device 604 is at least one micron wider than a lateral separation between the deep trench isolation structure 606 and the upper buried layer 610 along a length 616 of each sub-device 604. Contact between the deep well 612 and the lower buried layer 608 is increased by at least a micron along the widths 614 of the sub-devices 604 compared to the contact between the deep well 612 and the lower buried layer 608 along the length 616 of the sub-devices 604.

Figure 7:
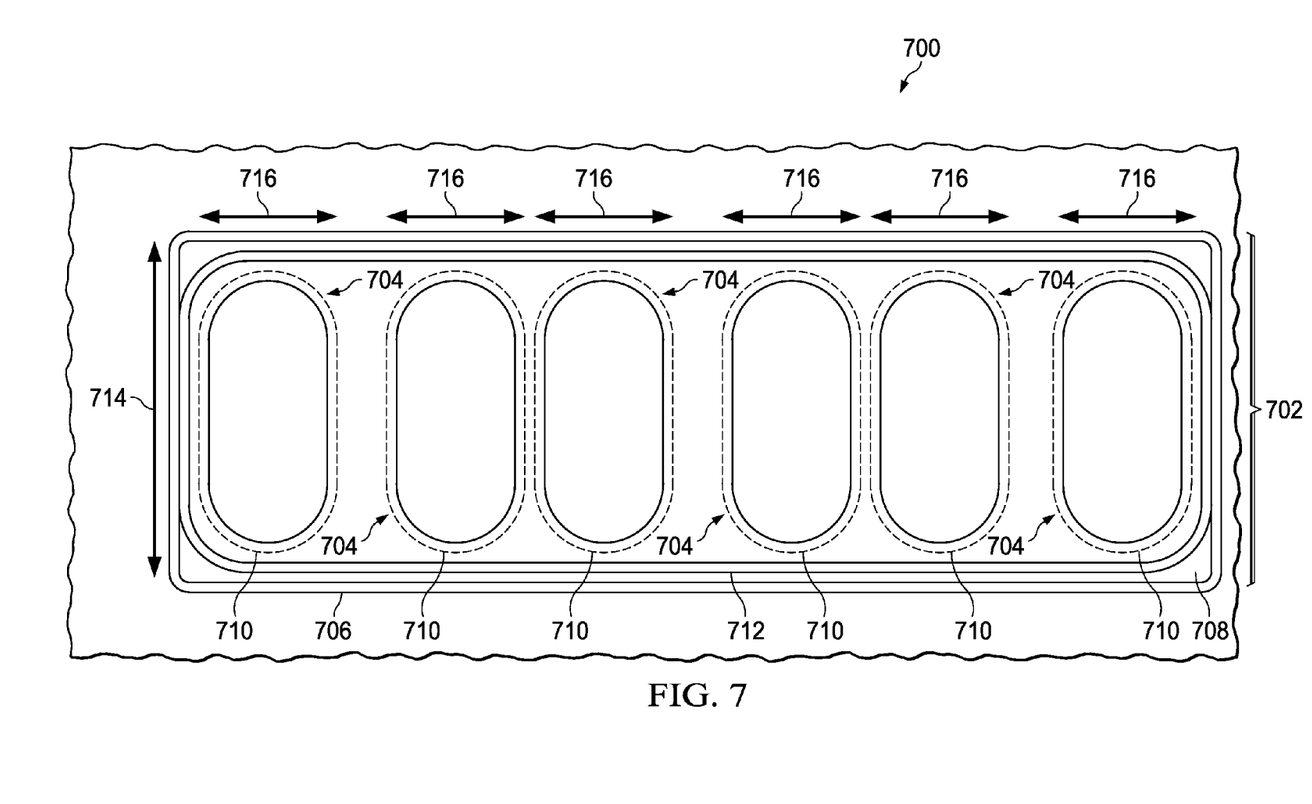

Referring to FIG. 7, the integrated circuit 700 includes the isolated device 702 comprising a plurality of isolated sub-devices 704 all of which are surrounded by one deep trench isolation structure 706. The sub-devices 704 are configured in a linear array so that adjacent sub-devices 704 abut along their respective lengths 714. The isolated sub-devices 704 are electrically isolated from a substrate of the integrated circuit 700 by a combination of the deep trench isolation structure 706 and a lower buried layer 708 enclosed by the deep trench isolation structure 706, the lower buried layer 708 having an opposite conductivity type from the substrate. Each sub-device 704 includes an instance of an upper buried layer 710 disposed over the lower buried layer 708, the upper buried layer 710 having the same conductivity type as the substrate. A deep well 712 of the sub-devices 704 having the same conductivity type as the lower buried layer 708 is disposed over a portion of the lower buried layer 708 which extends past the upper buried layers 710. The deep well 712 makes electrical contact to the lower buried layer 708.

To provide sufficient contact area between the deep well 712 and the lower buried layer 708, a lateral separation between the deep trench isolation structure 706 and the upper buried layers 710 along a length 714 on exactly one side of each sub-device 704 is at least one micron wider than a lateral separation between the deep trench isolation structure 706 and the upper buried layers 710 along a width 716 of each sub-device 704. Contact between the deep well 712 and the lower buried layer 708 is increased by at least a micron along the length 714 of each sub-device 704 compared to the contact between the deep well 712 and the lower buried layer 708 along the widths 716 of the sub-devices 704.

Figure 8:
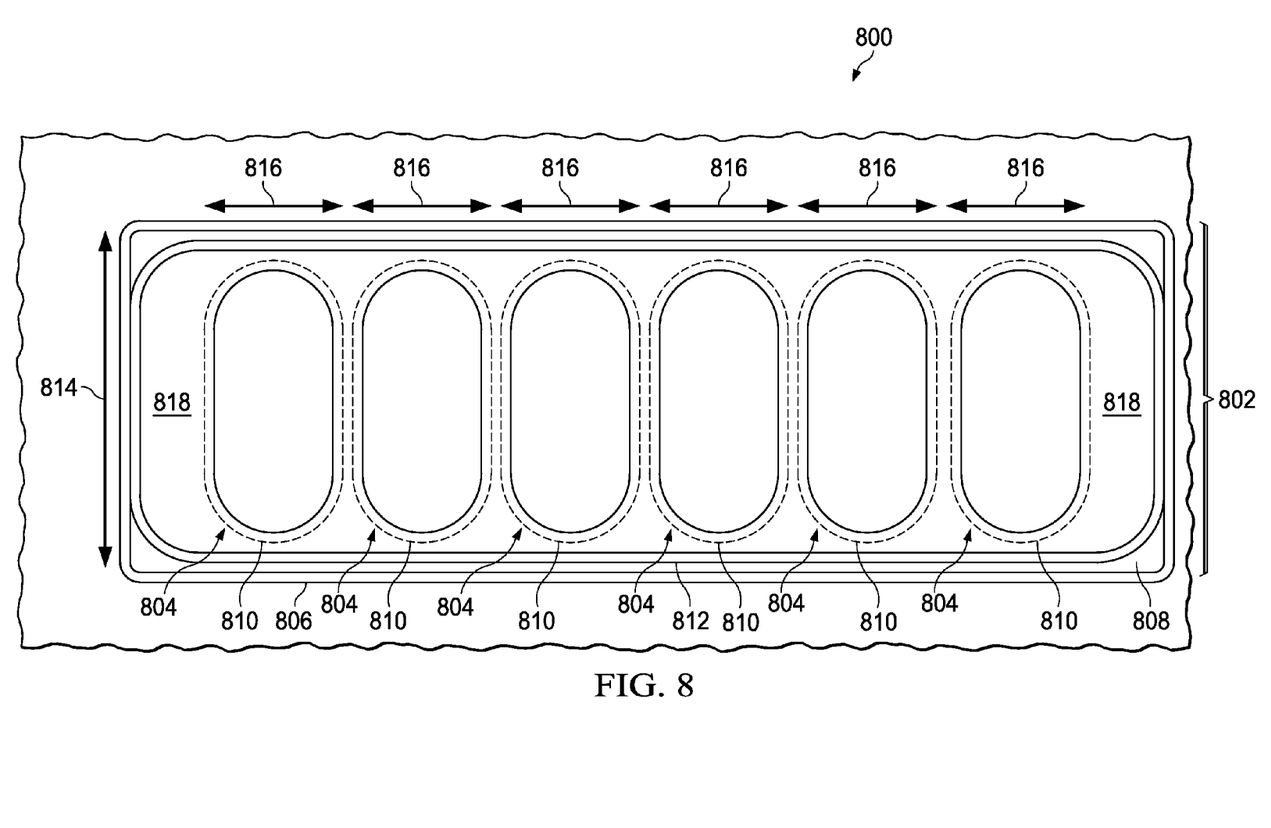

Referring to FIG. 8, the integrated circuit 800 includes the isolated device 802 comprising a plurality of isolated sub-devices 804 all of which are surrounded by one deep trench isolation structure 806. The sub-devices 804 are configured in a linear array so that adjacent sub-devices 804 abut along their respective lengths 814. The isolated sub-devices 804 are electrically isolated from a substrate of the integrated circuit 800 by a combination of the deep trench isolation structure 806 and a lower buried layer 808 enclosed by the deep trench isolation structure 806, the lower buried layer 808 having an opposite conductivity type from the substrate. Each sub-device 804 includes an instance of an upper buried layer 810 disposed over the lower buried layer 808, the upper buried layer 810 having the same conductivity type as the substrate. A deep well 812 of the sub-devices 804 having the same conductivity type as the lower buried layer 808 is disposed over a portion of the lower buried layer 808 which extends past the upper buried layers 810. The deep well 812 makes electrical contact to the lower buried layer 808.

To provide sufficient contact area between the deep well 812 and the lower buried layer 808, a lateral separation between the deep trench isolation structure 806 and the upper buried layers 810 along a length 814 on ends 818 of the plurality of sub-devices 804 is at least one micron wider than a lateral separation between the deep trench isolation structure 806 and the upper buried layers 810 along a width 816 of each sub-device 804. Contact between the deep well 812 and the lower buried layer 808 is increased by at least a micron along the length 814 of instances of the sub-devices 804 at the ends 818 of the plurality of sub-devices 804 compared to the contact between the deep well 812 and the lower buried layer 808 along the widths 816 of the sub-devices 804.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a semiconductor substrate;
   an isolated device disposed in and on the substrate;
   a lower buried layer disposed in the substrate under the isolated device, the lower buried layer having a conductivity type opposite from a conductivity type of the substrate;
   a deep trench isolation structure surrounding the isolated device;
   an upper buried layer disposed in the substrate under the isolated device and over the lower buried layer, the upper buried layer having the same conductivity type as the substrate; and
   a deep well disposed in the substrate around the isolated device, the deep well extending to and making electrical contact with the lower buried layer, the deep well having the same conductivity type as the lower buried layer, such that:
   a lateral separation between the deep trench isolation structure and the upper buried layer along a first side of the isolated device is at least one micron wider than a lateral separation between the deep trench isolation structure and the upper buried layer along a second side of the isolated device;
   the contact between the deep well and the lower buried layer is increased by at least a micron along the first side of the isolated device compared to the contact between the deep well and the lower buried layer along the second side of the isolated device; and
   a lateral width of the increased contact is less than one half a perimeter of the isolated device.

2. The integrated circuit of claim 1, wherein:
   the conductivity type of the substrate is p-type;
   the conductivity type of the lower buried layer is n-type;

the conductivity type of the upper buried layer is p-type; and the conductivity type of the deep well is n-type.

3. The integrated circuit of claim 1, wherein:
the conductivity type of the substrate is n-type;
the conductivity type of the lower buried layer is p-type;
the conductivity type of the upper buried layer is n-type; and
the conductivity type of the deep well is p-type.

4. The integrated circuit of claim 1, wherein the isolated device is a high-side laterally diffused n-channel metal oxide semiconductor (MOS) transistor.

5. The integrated circuit of claim 1, wherein the isolated device is a isolated extended drain n-channel MOS transistor.

6. The integrated circuit of claim 1, wherein:
the isolated device has a length;
the isolated device has a width which is shorter than the length; and
the increased contact is disposed along the width at one end of the isolated device.

7. The integrated circuit of claim 1, wherein:
the isolated device has a length;
the isolated device has a width which is shorter than the length; and
the increased contact is disposed along the width at two opposite ends of the isolated device.

8. The integrated circuit of claim 1, wherein:
the isolated device has a length;
the isolated device has a width which is shorter than the length; and
the increased contact is disposed along the length at exactly one side of the isolated device.

9. The integrated circuit of claim 1, wherein:
the isolated device comprises a plurality of sub-devices;
all of the sub-devices are surrounded by the deep trench isolation structure;
the sub-devices are configured in a linear array so that adjacent sub-devices abut along their respective lengths;
each of the sub-devices includes an instance of the upper buried layer disposed over the lower buried layer;
a lateral separation between the deep trench isolation structure and the instances of the upper buried layer along widths on at least one side of each sub-device is at least one micron wider than a lateral separation between the deep trench isolation structure and the upper buried layer along the length of each sub-device; and
contact between the deep well and the lower buried layer is increased by at least a micron along the widths of the sub-devices compared to the contact between the deep well and the lower buried layer along the length of the sub-devices.

10. The integrated circuit of claim 1, wherein:
the isolated device comprises a plurality of sub-devices;
all of the sub-devices are surrounded by the deep trench isolation structure;
the sub-devices are configured in a linear array so that adjacent sub-devices abut along their respective lengths;
each of the sub-devices includes an instance of the upper buried layer disposed over the lower buried layer;
a lateral separation between the deep trench isolation structure and the instances of the upper buried layer along lengths on exactly one side of each sub-device is at least one micron wider than a lateral separation between the deep trench isolation structure and the upper buried layer along a width of each sub-device; and
contact between the deep well and the lower buried layer is increased by at least a micron along the lengths of the sub-devices compared to the contact between the deep well and the lower buried layer along the width of the sub-devices.

\* \* \* \* \*